(12) United States Patent
Wang

(10) Patent No.: US 9,726,975 B2
(45) Date of Patent: Aug. 8, 2017

(54) PHOTORESIST COMPOSITION

(71) Applicant: BOE TECHNOLOGY GROUP CO., LTD., Beijing (CN)

(72) Inventor: Xuelan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/441,056

(22) PCT Filed: Oct. 24, 2014

(86) PCT No.: PCT/CN2014/089449
§ 371 (c)(1),
(2) Date: May 6, 2015

(87) PCT Pub. No.: WO2015/109878
PCT Pub. Date: Jul. 30, 2015

(65) Prior Publication Data
US 2015/0370165 A1   Dec. 24, 2015

(30) Foreign Application Priority Data

Jan. 27, 2014 (CN) .......................... 2014 1 0040176

(51) Int. Cl.
| | | |
|---|---|---|
| G03F 7/038 | (2006.01) | |
| G03F 7/004 | (2006.01) | |
| G03F 7/031 | (2006.01) | |
| G03F 7/033 | (2006.01) | |
| G03F 7/075 | (2006.01) | |
| G03F 7/105 | (2006.01) | |
| G03F 7/029 | (2006.01) | |

(52) U.S. Cl.
CPC ............ *G03F 7/038* (2013.01); *G03F 7/0048* (2013.01); *G03F 7/029* (2013.01); *G03F 7/031* (2013.01); *G03F 7/033* (2013.01); *G03F 7/0755* (2013.01); *G03F 7/105* (2013.01)

(58) Field of Classification Search
CPC ................................................... G03F 7/0752
See application file for complete search history.

(56) References Cited

U.S. PATENT DOCUMENTS

2008/0171800 A1* 7/2008 Dietz .................. C08K 5/5313
522/39
2015/0168827 A1* 6/2015 Yang ....................... G02B 1/04
430/280.1

FOREIGN PATENT DOCUMENTS

| CN | 1814675 A | | 8/2006 |
|---|---|---|---|
| CN | 101762979 A | * | 6/2010 |
| CN | 103205190 A | | 7/2013 |
| CN | 103376657 A | | 10/2013 |
| CN | 103421156 A | | 12/2013 |
| CN | 103792789 A | | 5/2014 |
| JP | 2004300173 A | | 10/2004 |
| JP | 2005115187 A | | 4/2005 |
| JP | 2006-215160 A | * | 8/2006 |
| JP | 2009-265268 A | * | 11/2009 |

OTHER PUBLICATIONS

English Translation of Bai et al CN 101762979 A published Jun. 30, 2010, obtained from ProQuest LLC in Jan. 2016, 9 pages.*
Liles, Donald T. , of Dow Corning Corporation, "The Fascinating World of Silicones", part 2, May 2012 from Coatingstech, pp. 34-46. obtained online.*
BYK-378 Safety Sheet, ten pages revision date Aug. 4, 2015, obtained online.*
SR295, pentaerythritol tetraacrylate, Product Detail, Sartomer dated 2016 one page, obtained online.*
SR494, ethoxylated (4 pentaerythritol tetraacrylate, Product Detail, Sartomer dated 2016 one page, obtained online.*
English translation of JP 2009-265268 a, year 2009 obtained online Jan. 5, 2016 from from machine translation from AIPN Japan Patent Office National Center for Industrial Property Information and Training, 11 pages.*
English translation of JP 2006-215160 a, year 2006 obtained online Jan. 5, 2016 from from machine translation from AIPN Japan Patent Office National Center for Industrial Property Information and Training, 10 pages.*
Perry, Donna, "Silicone Surface-Active Agents", Dow Corning Corporation, from www.dowcorning.com, copyright 2005, form No. 26-1365-01 , 12 pages.*
International Search Report of PCT/CN2014/089449 in Chinese with English translation, mailed Feb. 11, 2015.
Notice of Transmittal of the International Search Report of PCT/CN2014/089449 in Chinese mailed Feb. 11, 2015.
Written Opinion of the International Searching Authority of PCT/CN2014/089449 in Chinese with English translation mailed Feb. 11, 2015.
Chinese Office Action of Chinese Application No. 201410040176. X, mailed Jan. 8, 2015 with English translation.

* cited by examiner

*Primary Examiner* — Cynthia Hamilton
(74) *Attorney, Agent, or Firm* — Collard & Roe, P.C.

(57) ABSTRACT

A photoresist composition, comprising: from 0.1 to 1.0 parts of a polyether-modified organosilicon levelling agent 58; from 7 to 23 parts of a polyfunctional monomer; from 13 to 29 parts of a alkaline soluble resin; from 23 to 62.8 parts of a pigment dispersion; from 1.5 to 11.9 parts of a photo-initiator; and from 10 to 45 parts of a solvent, on the basis of parts by weight. The photoresist composition can solve the problem of poor levelling property of the coating film and shrinkage of the film surface after high temperature baking occurring in the existing photoresist composition.

14 Claims, No Drawings

PHOTORESIST COMPOSITION

CROSS REFERENCE TO RELATED APPLICATIONS

This application is the National Stage of PCT/CN2014/089449 filed on Oct. 24, 2014, which claims priority under 35 U.S.C. §119 of Chinese Application No. 201410040176.X filed on Jan. 27, 2014, the disclosure of which is incorporated by reference.

FIELD OF THE INVENTION

Embodiments of the present invention relate to a photoresist composition.

BACKGROUND OF THE INVENTION

One current commonly-used process for preparing a color film on a color filter is a pigment dispersion process. The basic principle thereof lies in coating a photoresist composition on a transparent substrate, and then illuminating it with an ultraviolet lamp and the like so as to solidify the photoresist composition to form a color film. The photoresist composition comprises a pigment dispersion, a monomer, an oligomer, a diluent, a levelling agent, a solvent and the like, wherein the levelling agent mainly functions to adjust levelling of a coating film of the photoresist composition. A process of preparing a photoresist pixel generally comprises coating, prebaking, exposure, development, and high temperature postbaking. If a photoresist composition pixel has a poor levelling property, a surface of a film shrinks very easily after high temperature postbaking. However, the existing photoresist compositions all have the above defects in use.

The present invention aims to provide a photoresist composition with improved levelling property.

SUMMARY OF THE INVENTION

An embodiment of the present invention provides a photoresist composition comprising: from 0.1 to 1.0 parts of a polyether-modified organosilicon levelling agent 58; from 7 to 23 parts of a polyfunctional monomer; from 13 to 29 parts of a alkaline soluble resin; from 23 to 62.8 parts of a pigment dispersion; from 1.5 to 11.9 parts of a photo-initiator; and from 10 to 45 parts of a solvent, on the basis of parts by weight.

In one aspect, the photoresist composition comprises: from 0.3 to 0.77 parts of a polyether-modified organosilicon levelling agent 58; from 10 to 18 parts of a polyfunctional monomer; from 14.6 to 23 parts of a alkaline soluble resin; from 33.2 to 48.72 parts of a pigment dispersion; from 3.5 to 8 parts of a photo-initiator; and from 15 to 35 parts of a solvent, on the basis of parts by weight.

In the photoresist composition, the polyfunctional monomers are two or more selected from a group of consisting of dipropylene glycol diacrylate, trimethylolpropane triacrylate, ethoxylated trimethylolpropane triacrylate, dipentaerythritol hexaacrylate, dipentaerythritol pentaacrylate, and pentaerythritol tetraacrylate.

For example, the polyfunctional monomers are selected from a group of consisting of: a combination of dipropylene glycol diacrylate and dipentaerythritol hexaacrylate; a combination of trimethylolpropane triacrylate and dipentaerythritol hexaacrylate; a combination of dipropylene glycol diacrylate and pentaerythritol tetraacrylate; a combination of trimethylolpropane triacrylate and pentaerythritol tetraacrylate; a combination of dipropylene glycol diacrylate and dipentaerythritol pentaacrylate; a combination of ethoxylated trimethylolpropane triacrylate and dipentaerythritol hexaacrylate; a combination of trimethylolpropane triacrylate and dipentaerythritol pentaacrylate; a combination of dipropylene glycol diacrylate, trimethylolpropane triacrylate and dipentaerythritol hexaacrylate; a combination of dipropylene glycol diacrylate, ethoxylated trimethylolpropane triacrylate and pentaerythritol tetraacrylate.

In the photoresist composition, the alkaline soluble resin is a copolymer of benzyl methacrylate, methyl methacrylate and/or butyl methacrylate.

In one aspect, the alkaline soluble resin is a copolymer polymerized by benzyl methacrylate, methyl methacrylate and butyl methacrylate in a weight ratio of 58-73:5-8:19-23, which has a weight-average molecular weight ranging from 8000 to 15000 and an acidity of 85 to 120.

In the photoresist composition, the pigment dispersion is selected from a group of consisting of a red pigment, a green pigment, a yellow pigment, a blue pigment and/or a purple pigment.

In the photoresist composition, the photo-initiator comprises benzoin photo-initiator, benzophenone photo-initiator, anthraquinone photo-initiator, acyl phosphine oxide, and any combination thereof.

In the photoresist composition, the solvent is one or more selected from a group of consisting of propylene glycol methyl ether acetate, propylene glycol diacetate, ethyl 3-ethoxy-3-imino propionate, 2-methyl heptane, 3-methyl heptane, cyclopentanone, and cyclohexanone.

The photoresist composition may further comprise one or more of a coupling agent, an antioxidant, a UV absorber, and a defoaming agent.

DETAILED DESCRIPTION OF INVENTION

The technical solutions of the examples of the present invention will be clearly and completely described below. It is obvious that the described examples are merely a portion rather than all of the examples of the present invention. Based on the examples of the present invention, all the other examples obtained by the skilled in the art in the premise of paying no creative labor belong to the protection scope of the present invention.

An embodiment of the present invention provides a photoresist composition comprising: from 0.1 to 1.0 parts of a polyether-modified organosilicon levelling agent 58; from 7 to 23 parts of a polyfunctional monomer; from 13 to 29 parts of a alkaline soluble resin; from 23 to 62.8 parts of a pigment dispersion; from 1.5 to 11.9 parts of a photo-initiator; and from 10 to 45 parts of a solvent, on the basis of parts by weight. The parts herein can also be represented by weight %, i.e., the photoresist composition comprises: 0.1-1.0% of a polyether-modified organosilicon levelling agent 58; 7-23% of a polyfunctional monomer; 13-29% of a alkaline soluble resin; 23-62.8% of a pigment dispersion; 1.5-11.9% of a photo-initiator; 10-45% of a solvent, on the basis of weight percent.

In one aspect, the photoresist composition comprises: from 0.3 to 0.77 parts of a polyether-modified organosilicon levelling agent 58; from 10 to 18 parts of a polyfunctional monomer; from 14.6 to 23 parts of a alkaline soluble resin; from 33.2 to 48.72 parts of a pigment dispersion; from 3.5 to 8 parts of a photo-initiator; and from 15 to 35 parts of a solvent, on the basis of parts by weight.

In the above photoresist composition, the polyether-modified organosilicon levelling agent 58 is a known levelling agent developed by Dow Corning Corporation, i.e., a organosilicon levelling agent 58 additive. The polyether-modified organosilicon levelling agent 58 additive is applied in the photoresist composition of the embodiment of the present invention mainly for improving the levelling property of the coating film of the photoresist composition. When used in combination with other auxiliary agents in the and/or butyl methacrylate. For example, the alkaline soluble resin is a copolymer polymerized by benzyl methacrylate, methyl methacrylate and butyl methacrylate in a weight ratio of 58-73:5-8:19-23, which has a weight-average molecular weight ranging from 8000 to 15000 and an acidity of 85 to 120. This type of copolymer has a better compatibility with organic solvents. The specific alkaline soluble resins (B1-B4) can be prepared from the raw materials of Table 1 (the preparation method thereof is the prior art):

TABLE 1

| | Components | | | | | | Copolymer properties | |
|---|---|---|---|---|---|---|---|---|
| | benzyl methacrylate | methyl methacrylate | butyl methacrylate | thermal initiator AIBN | solvent EEP | dodecanethiol | weight-average molecular weight | acidity |
| B1 | 58 g | 5 g | 19 g | 3.5 g | 170 g | 0.25 g | 8000 | 85 |
| B2 | 63 g | 6 g | 19 g | 3.5 g | 190 g | 0.25 g | 9000 | 95 |
| B3 | 67 g | 6 g | 21 g | 3.5 g | 210 g | 0.25 g | 12000 | 108 |
| B4 | 73 g | 8 g | 23 g | 3.5 g | 220 g | 0.25 g | 15000 | 120 | photoresist composition, it can thoroughly solve the problem that the film shows obvious shrinkage and unevenness after high temperature baking occurring in the existing photoresist composition.

In the photoresist composition, the polyfunctional monomer has two or more polymerisable ethylenically unsaturated bonds, which can therefore be cross-linked to form a netlike structure.

For example, the polyfunctional monomers are two or more selected from a group of consisting of dipropylene glycol diacrylate, trimethylolpropane triacrylate, ethoxylated trimethylolpropane triacrylate, dipentaerythritol hexaacrylate, dipentaerythritol pentaacrylate, and pentaerythritol tetraacrylate.

In one embodiment, the polyfunctional monomers are selected from a group of consisting of: a combination of dipropylene glycol diacrylate and dipentaerythritol hexaacrylate; a combination of trimethylolpropane triacrylate and dipentaerythritol hexaacrylate; a combination of dipropylene glycol diacrylate and pentaerythritol tetraacrylate; a combination of trimethylolpropane triacrylate and pentaerythritol tetraacrylate; a combination of dipropylene glycol diacrylate and dipentaerythritol pentaacrylate; a combination of ethoxylated trimethylolpropane triacrylate and dipentaerythritol hexaacrylate; a combination of trimethylolpropane triacrylate and dipentaerythritol pentaacrylate; a combination of dipropylene glycol diacrylate, trimethylolpropane triacrylate and dipentaerythritol hexaacrylate; a combination of dipropylene glycol diacrylate, ethoxylated trimethylolpropane triacrylate and pentaerythritol tetraacrylate.

When the above polyfunctional monomers are used in the photoresist composition as the above combination formed in a certain proportion, the resulting photoresist composition has the advantages of fast solidification rate, high cross-link density, low shrinkage, and good thermal stability. When the polyfunctional monomers are used in combination with the silicone levelling agent 58 additive in the photoresist composition of the present invention, the resulting film has better adhesion and the surface of the film formed after high temperature baking is compact and even.

In the photoresist composition, the alkaline soluble resin is a copolymer of benzyl methacrylate, methyl methacrylate In the photoresist composition, the pigment dispersion is selected from a group of consisting of a red pigment, a green pigment, a yellow pigment, a blue pigment and/or a purple pigment, and the like. The skilled in the art can select the desired color according to the actual requirement.

The photo-initiator comprises, but is not limited to, benzoin, benzophenone, anthraquinone photo-initiators, and acyl phosphine oxide. A mixture of two or more of the above photo-initiators can be used, which results in a higher initiation efficiency. The photo-initiator can be selected from commercialized products. After reading the description, the skilled in the art can determine an appropriate photo-initiator according to the requirement.

The solvent is one or more selected from a group of consisting of propylene glycol methyl ether acetate, propylene glycol diacetate, ethyl 3-ethoxy-3-imino propionate, 2-methyl heptane, 3-methyl heptane, cyclopentanone, and cyclohexanone. For example, the solvent is one or more selected from a group of consisting of propylene glycol methyl ether acetate, propylene glycol diacetate and 2-methyl heptane.

The photoresist composition according to the embodiment of the present invention can be prepared according to a conventional process in the art.

In addition, the photoresist composition can further comprise one or more of a coupling agent, an antioxidant, a UV absorber, and a defoaming agent. The usable coupling agent, antioxidant, UV absorber, and defoaming agent are all known products, which can be selected by the skilled in the art according to the actual requirement.

With the above technical solutions, the present disclosure provides a photoresist composition having good properties. The composition, based on a reasonable component design, solves the technical problems of poor levelling property of the coating film of the photoresist composition, and obvious shrinkage of the film surface after high temperature baking. The film prepared by the photoresist composition of the present disclosure has the advantages of compact and even surface of the film, which is significantly superior to the existing photoresist composition.

The technical solutions of the present invention are further detailedly described by specific examples hereafter. The examples are merely descriptive, rather than limiting the scope of the present invention.

Examples 1-10 (See Table 2)

The photoresist compositions of Examples 1-10 are formulated according to the components and the amounts thereof shown in the following Table 2.

The process of preparing the photoresist compositions of Examples 1-10 comprises: (1) mixing a alkaline soluble resin, a polyfunctional monomer, and a pigment liquid, and stirring them for 2-4 hours to achieve uniform mixing; (2) dissolving the initiator mixture with a half of the total solvent and stirring them for 4-8 hours; (3) mixing the two mixtures from step (1) and step (2), adding the additives, and stirring them for 2-4 hours, forming the photoresist composition.

TABLE 2

| Each component of photoresist composition (g) | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Alkaline soluble resin | B1 | 15.38 | — | — | 19.0 | — | — | — | 29.0 | — | — |
| | B2 | — | 20.1 | — | — | — | — | 23.0 | — | 25.0 | — |
| | B3 | — | — | 17.61 | — | — | 14.6 | — | — | — | — |
| | B4 | — | — | — | — | 13.0 | — | — | — | — | 14.7 |
| Polyfunctional monomer | A1 | 1.37 | — | 2.95 | — | — | — | 1.4 | 2 | 1.8 | — |
| | A2 | — | 3.06 | — | 1.75 | — | 2.56 | — | 2 | — | 2.47 |
| | A3 | — | — | — | 5.25 | 2.93 | — | — | — | 1.8 | 2.47 |
| | A4 | 10.98 | — | — | — | 14.67 | — | — | 6 | — | — |
| | A5 | — | — | — | — | — | 20.44 | 7.0 | — | — | 9.86 |
| | A6 | — | 12.25 | 10.33 | — | — | — | — | — | 9.0 | — |
| Photo-initiator | C1 | 1.86 | — | — | 0.88 | — | — | 1.7 | — | 0.72 | — |
| | C2 | 3.72 | 1.59 | 1.42 | — | 0.61 | — | — | 0.3 | — | 2.33 |
| | C3 | — | 4.76 | 5.68 | — | — | 2.28 | 10.2 | 1.2 | — | — |
| | C4 | — | — | — | 2.62 | 3.03 | 5.72 | — | — | 3.58 | 6.97 |
| Pigment liquid | D1 | 41.37 | — | — | — | — | — | 62.8 | — | — | 33.2 |
| | D2 | — | — | 38.5 | — | — | 45.5 | — | — | — | — |
| | D3 | — | 48.72 | — | — | 30 | — | — | 23.0 | — | — |
| | D4 | — | — | — | 28.7 | — | — | — | — | 50.0 | — |
| Organic solvent | E1 | — | — | 27.3 | — | — | 31.43 | — | — | 15.0 | — |
| | E2 | 17.32 | — | — | — | 34.8 | — | 10.0 | — | — | 35.0 |
| | E3 | — | 23.5 | — | 38.4 | — | — | — | 45.0 | — | — |
| Additive | F1 | 0.35 | 0.4 | 0.45 | 0.1 | 0.53 | 0.77 | 1.0 | 0.67 | 0.3 | 0.64 |
| | F2 | 0.04 | 0.03 | 0.05 | 0.04 | 0.04 | 0.04 | 0.07 | 0.05 | 0.08 | 0.06 |
| | F3 | 0.04 | 0.05 | 0.06 | 0.04 | 0.05 | 0.01 | 0.04 | 0.03 | 0.06 | 0.03 |
| | F4 | 0.03 | 0.05 | — | 0.05 | 0.03 | 0.02 | — | 0.04 | — | — |
| | F5 | 0.04 | — | — | — | 0.03 | — | 0.02 | — | — | 0.04 |

Wherein, among the polyfunctional monomers shown in Table 2, A1 is dipropylene glycol diacrylate, A2 is trimethylolpropane triacrylate, A3 is ethoxylated trimethylolpropane triacrylate, A4 is dipentaerythritol hexaacrylate, A5 is dipentaerythritol pentaacrylate, A6 is pentaerythritol tetraacrylate;

Among the photo-initiators, C1 is a benzoin photo-initiator (benzoin dimethyl ether, Shanghai Yiji Biological Reagents Co. Ltd.), C2 is a benzophenone photo-initiator (4-diphenyl benzophenone, Shanghai Ying Gong Industry Co. Ltd.), C3 is an anthraquinone photo-initiator, (2-ethyl anthraquinone, Nanjing Jiean Chemicals Industry Co. Ltd.), C4 is an acyl phosphine oxide photo-initiator (Irgacure 819, Nanjing Zhonghesheng Technology Co. Ltd.);

Among the alkaline soluble resins, B1: formed by copolymerization of benzyl methacrylate, methyl methacrylate and butyl methacrylate (in a weight ratio of 58:5:19), the resulting copolymer has a weight-average molecular weight of 8000 and an acidity of 85;

B2: formed by copolymerization of benzyl methacrylate, methyl methacrylate and butyl methacrylate (in a weight ratio of 63:6:19), the resulting copolymer has a weight-average molecular weight of 9000 and an acidity of 95;

B3: formed by copolymerization of benzyl methacrylate, methyl methacrylate and butyl methacrylate (in a weight ratio of 67:6:21), the resulting copolymer has a weight-average molecular weight of 12000 and an acidity of 108;

B4: formed by copolymerization of benzyl methacrylate, methyl methacrylate and butyl methacrylate (in a weight ratio of 73:8:23), the resulting copolymer has a weight-average molecular weight of 15000 and an acidity of 120;

Among the pigment liquids, D1 is a pigment dispersion of PR177 (PR177, Ciba corporation), D2 is a pigment dispersion of G36 (Green G36, DIC corporation, Japan), D3 is a pigment dispersion of B15:6 (Blue B15:6, DIC corporation, Japan) and V23 (Purple V23, LANXESS Shanghai Pigments Co., Ltd.) (in a ratio of 9:1), D4 is a pigment dispersion of G58 (DIC corporation, Japan);

Among the organic solvents, E1 is propylene glycol methyl ether acetate, E2 is propylene glycol diacetate, E3 is 2-methyl heptane;

Among the additives, F1 is a polyether-modified organosilicon levelling agent 58 additive, F2 is a coupling agent (A-186/A-187, Ark (FoGang) Chemicals Industry Co. Ltd.), F3 is an antioxidant (butyl hydroxyanisole, Fortune bio-tech Co., Ltd.), F4 is a UV absorber (UV absorber 234, J&K Scientific LTD.), F5 is a defoaming agent (organic modified polysiloxane, BYK Corporation, Germany) (all are commercially available products).

Comparison Examples 1-4 (See Table 3 for Details)

The photoresist compositions of Comparison Examples 1-4 are formulated according to the components and the amounts thereof shown in the following Table 3. The formulation processes of the photoresist compositions are the same as those of Examples 1-10.

TABLE 3

| Each component of photoresist composition (g) | | Comp. Ex. 1 | Comp. Ex. 2 | Comp. Ex. 3 | Comp. Ex. 4 |
|---|---|---|---|---|---|
| Alkaline soluble resin | B1 | — | — | 15.28 | — |
| | B2 | — | — | — | 25.0 |
| | B3 | 17.61 | — | — | — |
| | B4 | — | 13.3 | — | — |
| Polyfunctional Monomer | A1 | 13.28 | — | — | — |
| | A2 | — | — | — | — |
| | A3 | — | 8.4 | — | — |
| | A4 | — | — | — | — |
| | A5 | — | — | 12.35 | — |
| | A6 | — | — | — | 12.6 |
| Photo-initiator | C1 | 7.1 | — | — | — |
| | C2 | — | — | — | 4.3 |
| | C3 | — | 3.64 | — | — |
| | C4 | — | — | 5.58 | — |
| Pigment liquid | D1 | 33.2 | — | — | — |
| | D2 | — | 38.5 | — | — |
| | D3 | — | — | — | 50 |
| | D4 | — | — | 41.37 | — |
| Organic solvent | E1 | 27.3 | — | — | — |
| | E2 | — | 34.8 | 17.32 | — |
| | E3 | — | — | — | 15.1 |
| Additive | F1 | — | — | — | — |
| | F2 | 0.05 | 0.05 | 0.06 | 0.08 |
| | F3 | 0.03 | 0.02 | | 0.07 |
| | F4 | 0.03 | 0.01 | 0.04 | 0.04 |
| | F5 | 0.02 | | 0.05 | |

The specific meaning of each symbol in Table 3 is the same as that in Examples 1-10.

Experimental Example 1

Surface Observation

The photoresist compositions of Examples 1-10 and Comparison Examples 1-4 are coated on a glass substrate already having a BM layer (black photoresist layer), and all the films have a thickness of 2.0 micron. The coated glass substrates are baked in a baker at 100° C. for 2-3 minutes, irradiated with a UV light of 125 mJ/cm$^2$ via an exposure machine, and developed in the developing liquid at room temperature for 25-50 seconds. Thereafter, the coated glass substrates are washed with deionized water and blow-dried. The films are solidified in a baker at 201-230° C. for 20-30 min, to have a thickness of 2.0 micron. The resulting films are evaluated as follows:

1. Surface smoothness: the pixel surfaces are observed with a metallurgical microscope at a magnification of 100 times. Evaluation standards: ○ represents smooth surface, with a grade of 19-20; Δ represents a slightly uneven surface, with a grade of 14-15; ● represents surface having an apparent shrinkage and unevenness, with a grade of 9-10.

2. Surface compactness: the surfaces are observed with Hitachi S-4800 Cold Field Emission Scanning Electron Microscope. Evaluation standards: ○ represents compact surface, with a grade of 19-20; Δ represents surface slightly having small pores, with a grade of 14-15; ● represents surface having many apparent small pores, with a grade of 9-10.

3. Shrinkage of high temperature solidification: the thickness of the films before and after baking at 230° C. is tested by using an equation: solidification shrinkage=$(1-t1/t0)$, wherein, t0 is the film thickness before baking, t1 is the film thickness after baking. Evaluation standards: ○ represents solidification shrinkage below 5%, with a grade of 19-20; Δ represents solidification shrinkage below 8%, with a grade of 14-15; ● represents solidification shrinkage below 12%, with a grade of 9-10.

4. Adhesion: the peeling situations of the pattern relative to the substrate or whether or not the edge of the pattern is serrated are observed with a metallurgical microscope. Evaluation standards: ○ represents the pattern having no peeling relative to the substrate and the edge of the pixel being regular, with a grade of 19-20; Δ represents the pattern having no peeling relative to the substrate and the edge of the pixel being slightly serrated, with a grade of 14-15; ● represents the pattern having peeling relative to the substrate and the edge of the pixel being apparently serrated, with a grade of 9-10.

5. Light sensitivity: the photoresist compositions are coated on a glass substrate already having a BM layer, and all the films have a thickness of 2.0 micron. The coated glass substrate are baked in a baker at 100° C. for 2 minutes. An optical density scale table are clung to the above films, which are irradiated with a UV light of 125 mJ/cm$^2$ and developed in the developing liquid at room temperature for 25-50 seconds. The coated glass substrates are washed with deionized water and blow-dried. The development situations are observed. The grade of development is evaluated, and high grade represents high sensitivity. Evaluation standards: ○ a grade of 19-20; Δ a grade of 14-15; ● a grade of 9-10.

See Table 4 and Table 5 for the experimental results.

TABLE 4

| | Evaluation results | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Evaluation Indexes | Surface smoothness | ○ (20) | ○ (20) | ○ (20) | ○ (20) | ○ (19) | Δ (15) | ○ (20) | ○ (20) | ○ (20) | ○ (14) |
| | Surface compactness | ○ (20) | ○ (20) | ○ (20) | Δ (14) | ○ (19) | ○ (19) | Δ (15) | Δ (15) | ○ (20) | ○ (20) |
| | Shrinkage of high temperature solidification | ○ (20) | ○ (20) | ○ (20) | ○ (20) | ○ (20) | ○ (20) | ○ (20) | Δ (15) | ○ (20) | Δ (14) |
| | Adhesion | ○ (20) | ○ (20) | ○ (20) | ○ (20) | Δ (15) | Δ (15) | ○ (20) | ○ (20) | ○ (20) | Δ (15) |
| | Light sensitivity | ○ (20) | ○ (20) | ○ (20) | Δ (15) | ○ (20) | ○ (19) | Δ (15) | Δ (15) | ○ (20) | ○ (20) |

TABLE 5

| | Evaluation results | Comp. Ex. 1 | Comp. Ex. 2 | Comp. Ex. 3 | Comp. Ex. 4 |
|---|---|---|---|---|---|
| Evaluation Indexes | Surface smoothness | ● (10) | ● (10) | ● (10) | ● (9) |

TABLE 5-continued

| Evaluation results | Comp. Ex. 1 | Comp. Ex. 2 | Comp. Ex. 3 | Comp. Ex. 4 |
|---|---|---|---|---|
| Surface compactness | ● (10) | ● (9) | ● (10) | Δ (15) |
| Shrinkage of high temperature solidification | Δ (15) | ○ (19) | ● (9) | ● (9) |
| Adhesion | Δ (15) | ● (9) | Δ (15) | ● (10) |
| Light sensitivity | ● (10) | ● (9) | ● (10) | ● (10) |

The above experimental results shows that: in the present invention, by a combination of each component in an appropriate proportion and addition of polyether-modified organosilicon levelling agent 58 additive, the pixel surface prepared by the photoresist composition has good smoothness and compactness, and has better high-temperature solidification shrinkage, adhesion and light sensitivity, wherein Examples 1, 2, 3 and 9 have the optimum effects. However, the surface of the film formed by the photoresist composition of each Comparison Example is very poor, and the high-temperature solidification shrinkage, adhesion, light sensitivity, and the like are poorer, either The embodiment solutions of the above Examples may be further combined or replaced, and the Examples merely describe the preferred examples of the present invention, rather than limiting the concept and scope of the present invention. Without deviation of the concept of the present invention, the skilled in the art can make the various changes and improvements to the technical solutions of the present invention, which all belong to the protection scope of the present invention.

This application claims priority to Chinese Patent Application No. 201410040176.X filed on Jan. 27, 2014, the disclosure of which is incorporated herein in its entirety as part of the present application.

The invention claimed is:

1. A photoresist composition, comprising: from 0.1 to 1.0 parts of a polyether-modified organosilicon levelling agent; from 7 to 23 parts of a polyfunctional monomer; from 13 to 29 parts of a alkaline soluble resin; from 23 to 62.8 parts of a pigment dispersion; from 1.5 to 11.9 parts of a photo-initiator; and from 10 to 45 parts of a solvent, on the basis of parts by weight,
wherein, the polyfunctional monomer is selected from the group consisting of a combination of dipropylene glycol diacrylate and dipentaerythritol hexaacrylate; a combination of trimethylolpropane triacrylate and dipentaerythritol hexaacrylate; a combination of dipropylene glycol diacrylate and pentaerythritol tetraacrylate; a combination of trimethylolpropane triacrylate and pentaerythritol tetraacrylate; a combination of dipropylene glycol diacrylate and dipentaerythritol pentaacrylate; a combination of ethoxylated trimethylolpropane triacrylate and dipentaerythritol hexaacrylate; a combination of trimethylolpropane triacrylate and dipentaerythritol pentaacrylate; a combination of dipropylene glycol diacrylate, trimethylolpropane triacrylate and dipentaerythritol hexaacrylate; and a combination of dipropylene glycol diacrylate, ethoxylated trimethylolpropane triacrylate and pentaerythritol tetraacrylate.

2. The photoresist composition according to claim 1, wherein, the photoresist composition comprises: from 0.3 to 0.77 parts of the polyether-modified organosilicon levelling agent; from 10 to 18 parts of the polyfunctional monomer; from 14.6 to 23 parts of the alkaline soluble resin; from 33.2 to 48.72 parts of the pigment dispersion; from 3.5 to 8 parts of the photo-initiator; and from 15 to 35 parts of the solvent, on the basis of parts by weight.

3. The photoresist composition according to claim 1, wherein, the alkaline soluble resin is prepared by copolymerizing benzyl methacrylate, methyl methacrylate and butyl methacrylate in the presence of azobisisobutyronitrile (AIBN) as a thermal initiator and dodecanethiol as a chain transferring agent in a solvent ethyl 3-ethoxypropionate (EEP).

4. The photoresist composition according to claim 3, wherein, the alkaline soluble resin is prepared by copolymerizing benzyl methacrylate, methyl methacrylate and butyl methacrylate in a weight ratio of 58-73:5-8:19-23 in the presence of azobisisobutyronitrile (AIBN) as a thermal initiator and dodecanethiol as a chain transferring agent in a solvent ethyl 3-ethoxypropionate (EEP), the alkaline soluble resin has a weight-average molecular weight ranging from 8000 to 15000 and an acidity of 85 to 120.

5. The photoresist composition according to claim 1, wherein, the pigment dispersion is selected from the group consisting of a red pigment, a green pigment, a yellow pigment, a blue pigment, a purple pigment, and mixtures thereof.

6. The photoresist composition according to claim 1, wherein, the photo-initiator is selected from the group consisting of a benzoin photo-initiator, a benzophenone photo-initiator, an anthraquinone photo-initiator, acyl phosphine oxide, and mixtures thereof.

7. The photoresist composition according to claim 1, wherein, the solvent is one or more selected from the group consisting of propylene glycol methyl ether acetate, propylene glycol diacetate, ethyl 3-ethoxy-3-imino propionate, 2-methyl heptane, 3-methyl heptane, cyclopentanone, and cyclohexanone.

8. The photoresist composition according to claim 1, wherein, the photoresist composition further comprises one or more of a coupling agent, an antioxidant, a UV absorber, and a defoaming agent.

9. The photoresist composition according to claim 2, wherein, the alkaline soluble resin is prepared by copolymerizing benzyl methacrylate, methyl methacrylate and butyl methacrylate in the presence of azobisisobutyronitrile (AIBN) as a thermal initiator and dodecanethiol as a chain transferring agent in a solvent ethyl 3-ethoxypropionate (EEP).

10. The photoresist composition according to claim 9, wherein, the alkaline soluble resin is prepared by copolymerizing benzyl methacrylate, methyl methacrylate and butyl methacrylate in a weight ratio of 58-73:5-8:19-23 in the presence of azobisisobutyronitrile (AIBN) as a thermal initiator and dodecanethiol as a chain transferring agent in a solvent ethyl 3-ethoxypropionate (EEP), the alkaline soluble resin has a weight-average molecular weight ranging from 8000 to 15000 and an acidity of 85 to 120.

11. The photoresist composition according to claim 2, wherein, the pigment dispersion is selected from a group consisting of a red pigment, a green pigment, a yellow pigment, a blue pigment, a purple pigment, and mixtures thereof.

12. The photoresist composition according to claim 2, wherein, the photo-initiator is one or more selected from the group consisting of a benzoin photo-initiator, a benzophenone photo-initiator, an anthraquinone photo-initiator, and acyl phosphine oxide.

13. The photoresist composition according to claim 2, wherein, the solvent is one or more selected from the group consisting of propylene glycol methyl ether acetate, propylene glycol diacetate, ethyl 3-ethoxy-3-imino propionate, 2-methyl heptane, 3-methyl heptane, cyclopentanone, and cyclohexanone.

14. The photoresist composition according to claim 2, wherein, the photoresist composition further comprises one or more of a coupling agent, an antioxidant, a UV absorber, and a defoaming agent.

* * * * *